US012604664B2

(12) United States Patent
Chen et al.

(10) Patent No.: US 12,604,664 B2
(45) Date of Patent: Apr. 14, 2026

(54) FLEXIBLE LEAD-FREE PIEZOELECTRIC COMPOSITE FILM AND PREPARATION METHOD THEREOF, AND ELECTRONIC DEVICE

(71) Applicant: TWENTY FOUR HOURS INTERNATIONAL PTE. LTD., Paya Lebar (SG)

(72) Inventors: Junhua Chen, Paya Lebar (SG); Xiaosong Zhang, Tianjin (CN)

(73) Assignee: TWENTY FOUR HOURS INTERNATIONAL PTE. LTD., Paya Lebar (SG)

( * ) Notice: Subject to any disclaimer, the term of this patent is extended or adjusted under 35 U.S.C. 154(b) by 0 days.

(21) Appl. No.: 19/342,409

(22) Filed: Sep. 26, 2025

(65) Prior Publication Data

US 2026/0033241 A1     Jan. 29, 2026

(51) Int. Cl.
| | |
|---|---|
| *H10N 30/092* | (2023.01) |
| *H10N 30/093* | (2023.01) |
| *H10N 30/85* | (2023.01) |
| *H10N 30/853* | (2023.01) |
| *H10N 30/88* | (2023.01) |

(52) U.S. Cl.
CPC ......... *H10N 30/092* (2023.02); *H10N 30/093* (2023.02); *H10N 30/852* (2023.02); *H10N 30/8536* (2023.02); *H10N 30/88* (2023.02)

(58) Field of Classification Search
CPC .. H10N 30/092; H10N 30/093; H10N 30/852; H10N 30/8536; H10N 30/88; H10N 30/06; H10N 30/8542; Y10T 29/42
See application file for complete search history.

(56) References Cited

U.S. PATENT DOCUMENTS

| | | | | |
|---|---|---|---|---|
| 8,501,031 B2 * | 8/2013 | Zhang | ............... | H10N 30/8542 |
| | | | | 501/134 |
| 12,256,640 B2 * | 3/2025 | Guhathakurta | ...... | H10N 30/852 |
| 12,310,241 B2 * | 5/2025 | Yang | ..................... | H10N 30/06 |
| 12,408,555 B2 * | 9/2025 | Zheng | ................. | H10N 30/092 |
| 2022/0158075 A1 | 5/2022 | Khaliq et al. | | |

* cited by examiner

*Primary Examiner* — Donghai D Nguyen

(57) ABSTRACT

A method for preparing a flexible lead-free piezoelectric composite film, in which a rare-earth-doped $SrSb_xSc_{2-x}TaCl_2O_8$ precursor powder is prepared and coated with a $BaTiO_3$ shell to form core-shell nanoparticles, and the core-shell nanoparticles are dispersed in a polyvinylidene fluoride (PVDF) matrix to obtain the flexible lead-free piezoelectric composite film. An electronic device including such piezoelectric composite film is also provided.

18 Claims, 16 Drawing Sheets
(10 of 16 Drawing Sheet(s) Filed in Color)

A

Preparing a rare-earth-doped $SrSb_xSc_{2-x}TaCl_2O_8$ precursor powder, where $0.8 < x < 1.2$

B

Coating the rare-earth-doped $SrSb_xSc_{2-x}TaCl_2O_8$ precursor powder with a $BaTiO_3$ shell to form core-shell nanoparticles

C

Dispersing the core-shell nanoparticles in a polyvinylidene fluoride (PVDF) matrix to obtain a flexible lead-free piezoelectric composite film Preparing a rare-earth-doped SrSb$_x$Sc$_{2-x}$TaCl$_2$O$_8$ precursor powder, where $0.8 < x < 1.2$  —— A Coating the rare-earth-doped SrSb$_x$Sc$_{2-x}$TaCl$_2$O$_8$ precursor powder with a BaTiO$_3$ shell to form core-shell nanoparticles  —— B Dispersing the core-shell nanoparticles in a polyvinylidene fluoride (PVDF) matrix to obtain a flexible lead-free piezoelectric composite film  —— C Rare-earth-doped $SrSb_xSc_{2-x}TaCl_2O_8$ $BaTiO_3$

FLEXIBLE LEAD-FREE PIEZOELECTRIC COMPOSITE FILM AND PREPARATION METHOD THEREOF, AND ELECTRONIC DEVICE

TECHNICAL FIELD

This application relates to piezoelectric materials, and more particularly to a flexible lead-free piezoelectric composite film and a preparation method thereof, and an electronic device with the flexible lead-free piezoelectric composite film.

BACKGROUND

Ultrasonic atomization technology has been widely used in the fields of medicine, industry, and environmental protection due to its advantages of high efficiency, low noise and strong controllability. Conventional ultrasonic atomizers mainly adopt lead-containing piezoelectric ceramics (e.g., lead zirconate titanate $(Pb(Zr_{1-x}Ti_x)O_3$, PZT)) as the core transducer material, which struggle with the following drawbacks.

(1) Conventional PZT materials generally contains 60% or more of lead, and toxic lead-containing compounds will be released during the production, use and disposal processes of these materials, thereby leading to serious environmental pollutions. Currently, the use of lead-containing electronic products has been strictly limited by the European Union restriction of the use of certain hazardous substances directive (EU RoHS Directive).

(2) The lead-containing piezoelectric ceramics exhibit inherent fragility, which renders the devices fragile and prone to fracture failure under bending and impact conditions, making it difficult to meet the development requirements of flexible electronic devices and wearable devices.

(3) The electromechanical conversion efficiency of the conventional atomizers is generally lower than 70%. When operating at a conventional power of 20-40 W, their low energy efficiency will result in high energy consumption, thereby limiting the operation time of the portable devices.

(4) The droplets produced by the conventional atomizers generally have a relatively wide size distribution $(D_{50}=5-10$ μm, relative standard deviation (RSD)>15%). The insufficient atomization homogeneity makes it difficult to meet the high requirement for droplet size uniformity in nebulization therapy.

Current researches of the lead-free piezoelectric materials mainly focus on a $BaTiO_3$ system and a $Na_{0.5}Ba_{0.5}TiO_3$ system. However, these systems still struggle with the following drawbacks.

(1) Insufficient Piezoelectric Performance

The piezoelectric constant $(d_{33})$ of the lead-free piezoelectric materials is generally low (<300 pC/N), much lower than that of PZT materials (400-600 pC/N), making it difficult to achieve the highly-efficient atomization.

(2) Poor Thermal Stability

Most of lead-free materials will experience a significant performance degradation under high-temperature conditions due to their low Curie temperature (<200° C.), thereby limiting their applications.

(3) Interfacial Compatibility

In polymer-based composites, weak interfacial bonding between inorganic fillers and the polymer matrix leads to low stress transfer efficiency and rapid performance degradation during the use.

(4) Complex Preparation Process

The fabrication of the flexible piezoelectric devices involves high-temperature sintering and precise electrode processing, leading to a high production cost and hindering the popularization of the flexible piezoelectric devices.

SUMMARY

In view of this, to solve at least one of the aforementioned technical problems, the present disclosure provides a flexible lead-free piezoelectric composite film and a preparation method thereof, and an electronic device with the flexible lead-free piezoelectric composite film.

In a first aspect, the present disclosure provides a method of preparing a flexible lead-free piezoelectric composite film, comprising:

(A) preparing a $SrSb_xSc_{2-x}TaCl_2O_8$ precursor powder doped with a rare-earth-doped element, wherein $0.8<x<1.2$;

(B) coating the $SrSb_xSc_{2-x}TaCl_2O_8$ precursor powder with a shell to form a core-shell nanoparticle, wherein the shell is made from $BaTiO_3$; and (C) dispersing the core-shell nanoparticle in a polyvinylidene fluoride (PVDF) matrix to obtain the flexible lead-free piezoelectric composite film.

In an embodiment, step (A) comprises:

(A1) weighing $Sr(NO_3)_2$, $SbCl_3$, $Sc(NO_3)_3 \cdot 6H_2O$, $TaCl_5$ and a rare earth nitrate based on a stoichiometric ratio, and dissolving $Sr(NO_3)_2$, $SbCl_3$, $Sc(NO_3)_3 \cdot 6H_2O$, $TaCl_5$ and the rare earth nitrate in a polar solvent to obtain a mixture solution;

(A2) subjecting the mixture solution to hydrothermal synthesis in a sealed container, and cooling to obtain an intermediate product; and (A3) subjecting the intermediate product to centrifugation, washing, and drying to obtain the $SrSb_xSc_{2-x}TaCl_2O_8$ precursor powder doped with the rare-earth element.

In an embodiment, in step (A), the rare-earth element is a lanthanide element.

In an embodiment, in step (A1), the rare earth nitrate is selected from the group consisting of $Eu(NO_3)_3 \cdot 6H_2O$, $Er(NO_3)_3 \cdot 5H_2O$, $Yb(NO_3)_3 \cdot 4H_2O$, $Tm(NO_3)_3 \cdot 4H_2O$ and a combination thereof, and a total molar amount of the rare-earth element is 0.5-5.0% of a molar amount of Sr in the $SrSb_xSc_{2-x}TaCl_2O_8$ precursor powder.

In an embodiment, in step (A1), the polar solvent is a mixture of ethylene glycol and water in a volume ratio of 2-4:1, and a solid-to-liquid ratio for dissolution is 0.10±0.05 g/mL.

In an embodiment, the step (A2) is performed through steps of:

heating the mixture solution to 170-190° C. at a rate of 5° C./min followed by holding at 170-190° C. for 7-9 h;

heating the mixture solution to 210-230° C. at a rate of 1° C./min followed by holding at 210-230° C. for 10-15 h; and naturally cooling the mixture solution to 60° C.

In an embodiment, step (B) comprises:

(B1) ultrasonically dispersing the $SrSb_xSc_{2-x}TaCl_2O_8$ precursor in an anhydrous ethanol to form a suspension of the $SrSb_xSc_{2-x}TaCl_2O_8$ precursor powder;

(B2) simultaneously dropwise adding a barium ion source solution and titanium ion source solution at an equal rate to the suspension under mechanical stirring, followed by directed heterogeneous nucleation to achieve a shell-coating treatment, so as to obtain an intermediate product; and (B3) subjecting the intermediate product to centrifugation to collect a precipitate, and calcining the precipitate to form the core-shell nanoparticle.

In an embodiment, the barium ion source solution is a solution of barium acetate in ethanol; and the titanium ion source solution is a complex of tetrabutyl titanate and acetylacetone.

In an embodiment, step (C) comprises:

(C1) mixing the core-shell nanoparticle with a solution of the PVDF matrix to obtain a solid-liquid mixture;

(C2) subjecting the solid-liquid mixture to roll milling to obtain a slurry; and (C3) subjecting the slurry to tape casting to form the flexible lead-free piezoelectric composite film.

In an embodiment, the step (C) further comprises:

(C4) subjecting the flexible lead-free piezoelectric composite film to an internal stress relief treatment.

In an embodiment, the solution of the PVDF matrix is N-methylpyrrolidone (NMP), wherein a weight ratio of PVDF to NMP is 1:8-12.

In an embodiment, a diameter of a core part of the core-shell nanoparticle is 80-150 nm; and a thickness of a shell part of the core-shell nanoparticle is 5-50 nm.

In an embodiment, a weight percentage of the core-shell nanoparticle in the flexible lead-free piezoelectric composite film is 30-70%; and the PVDF matrix is a PVDF polymer with a $\beta$-crystalline phase content exceeding 80%.

In a second aspect, the present disclosure provides a flexible lead-free piezoelectric composite film prepared by the aforementioned methods.

In a third aspect, the present disclosure provides an electronic device, comprising:

the flexible lead-free piezoelectric composite film.

In an embodiment, the electronic device is an atomizer, comprising:

an atomizing component;

wherein the atomizing component comprises a flexible substrate, an electrode layer, a piezoelectric functional layer and a waterproof protection layer stacked in sequence; and the piezoelectric functional layer is the flexible lead-free piezoelectric composite film.

In an embodiment, the electrode layer has an interdigital electrode structure with an electrode width of 50-200 µm and an electrode spacing of 100-300 µm.

In an embodiment, the flexible substrate is made of a polyimide (PI) film or a polyethylene terephthalate (PET) film; a thickness of the flexible substrate is 50-200 µm; and a surface roughness Ra of the flexible substrate is not greater than 0.1 µm.

In an embodiment, the waterproof protection layer is a nano hydrophobic coating to prevent water molecules from seeping into the electrode layer and the piezoelectric functional layer to avoid short circuits or performance degradation, so as to enable the atomizing component to maintain a normal function in an immersed condition or a damp environment. Moreover, it has a minimal impact on the vibration performance of the piezoelectric functional layer due to its extremely small thickness.

In an embodiment, the nano hydrophobic coating is made of a fluoropolymer material, which is selected from the group consisting of perfluoropolyether (PFPE), polytetrafluoroethylene (PTFE), fluorinated acrylate and a combination thereof. These materials exhibit extremely low surface energy and excellent chemical stability. A thickness of the nano hydrophobic coating is 0.5-10 µm, preferably 1-5 µm. This thickness range can ensure effective waterproof performance while maximally maintaining the flexibility and piezoelectric vibration performance of the atomization element, avoiding the introduction of additional mechanical loads and ensuring the atomization efficiency.

In an embodiment, the nano hydrophobic coating exhibits a water contact angle greater than 120°, preferably greater than 150°, to achieve a superhydrophobic effect; and a surface roughness Ra of the nano hydrophobic coating is not greater than 0.05 µm to form a uniform and compacted protection film to provide the desired waterproof performance.

In an embodiment, the nano hydrophobic layer is formed on the surface of the piezoelectric functional layer through vapor deposition, dip coating, spin coating or spray coating.

In some embodiments, the assembled structure is subjected to thermal treatment, such as 50-120° C. for 0.5-2 h, to enhance the compactness of the nano hydrophobic coating.

A novel rare-earth-doped $SrSb_xSc_{2-x}TaCl_2O_8$ material (abbreviated as SSSTO: RE, where $RE=Eu^{3+}/Er^{3+}/Yb^{3+}/Tm^{3+}$) is designed and served as a piezoelectric substrate. The crystal structure and piezoelectric performance are optimized by adjusting the Sb/Ta ratio; a barium titanate shell is coated on the surface of SSSTO:RE for interfacial optimization to obtain SSSTO: $RE@BaTiO_3$ nanoparticles, thereby generating multiple efficiency enhancement mechanisms; and eventually, SSSTO:$RE@BaTiO_3$ nanoparticles are combined with PVDF to form a flexible lead-free piezoelectric composite film. The flexible lead-free piezoelectric composite film can be applied in electronic devices, especially in atomizers. The technical solutions of the present disclosure solve the contradiction among piezoelectricity, flexibility and lead-free characteristic.

It has been experimentally proved that the introduction of rare earth elements can induce anisotropic lattice distortion in the SSSTO crystal, thereby increasing the piezoelectric coefficient $d_{33}$ to 35 pC/N. The $BaTiO_3$ shell (with a thickness of approximately 15 nm) can optimize the dielectric matching, enabling the breakdown field strength of the composite film to reach 180 kV/mm. The three-roll milling and stepwise-drying process ensures that the $\beta$-crystalline phase content is greater than 75%, and the final atomization efficiency reaches 380 mL/h W, which is 45% or more higher than that of the existing lead-free atomizers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present disclosure will be described with reference to the following preferable embodiments and the accompanying figures. The embodiments and drawings are merely illustrative, instead of liming the present disclosure.

DETAILED DESCRIPTION OF EMBODIMENTS

The technical solutions of the present disclosure will be described clearly and completely below with reference to the accompanying figures and embodiments. Obviously, described below are merely some embodiments of the present disclosure, instead of all embodiments. Other embodiments obtained by those skilled in the art based on these embodiments without paying creative effort shall fall within the scope of the disclosure defined by the appended claims.

Figure 1:
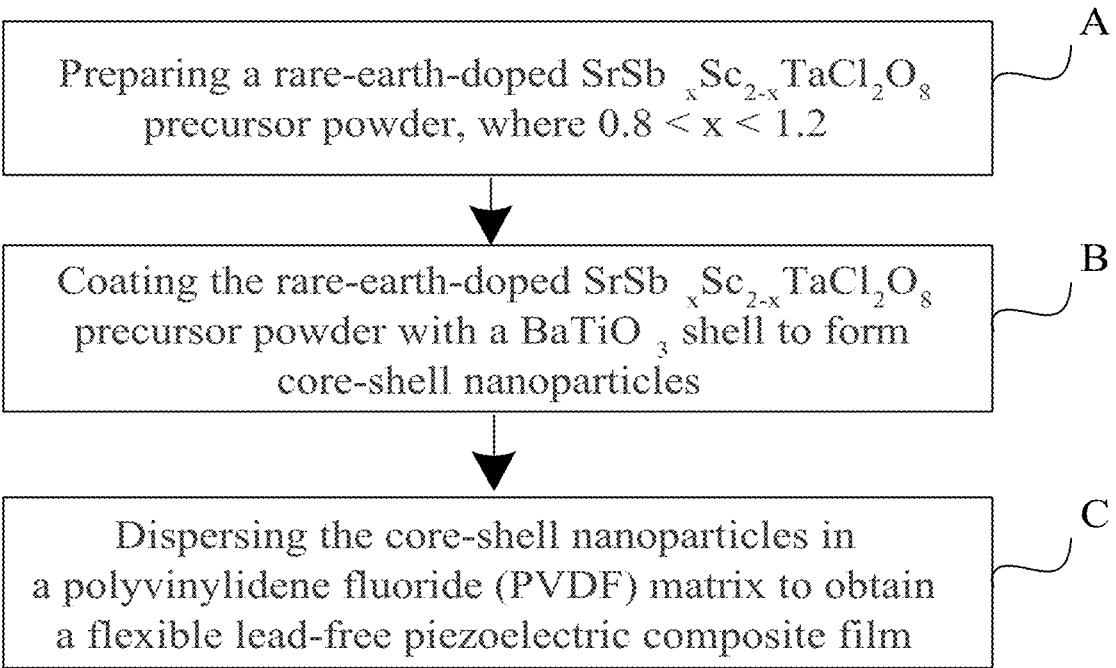
FIG. 1 is a flow chart of a method of preparing a flexible lead-free piezoelectric composite film according to an embodiment of the present disclosure.

Referring to FIG. 1, in a first aspect, the present disclosure provides a method of preparing a flexible lead-free piezoelectric composite film, including the following steps (A)-(C).

Step (A) A rare-earth-doped $SrSb_xSc_{2-x}TaCl_2O_8$ precursor powder is prepared, where $0.8<x<1.2$.

In an embodiment, step (A) includes the following steps.

step (A1) $Sr(NO_3)_2$, $SbCl_3$, $Sc(NO_3)_3 \cdot 6H_2O$, $TaCl_5$ and a rare earth nitrate are weighed based on a stoichiometric ratio, and dissolved in a polar solvent to obtain a mixture solution.

step (A2) The mixture solution is subjected to hydrothermal synthesis in a sealed container, and cooled to obtain a suspension product.

step (A3) The suspension product was subjected to separation to obtain the rare-earth-doped $SrSb_xSc_{2-x}TaCl_2O_8$ precursor powder.

In some embodiments, the step (A) is specifically performed as follows. In a glovebox with strictly controlled humidity and oxygen level ($H_2O$ and $O_2$ concentrations both less than 0.1 ppm), $Sr(NO_3)_2$, $SbCl_3$, $Sc(NO_3)_3 \cdot 6H_2O$, $TaCl_5$ and the rare earth nitrate (selected from the group consisting of $Eu(NO_3)_3 \cdot 6H_2O$, $Er(NO_3)_3 \cdot 5H_2O$, $Yb(NO_3)_3 \cdot 4H_2O$, $Tm(NO_3)_3 \cdot 4H_2O$ and a combination thereof, and a total molar amount of the rare-earth elements is 0.5-5.0% of a molar amount of Sr) are weighed based on the stoichiometric ratio. The raw materials are transferred into a reactor with a polytetrafluoroethylene (PTFE) liner, and then a mixture of ethylene glycol and water in a volume ratio of 2-4:1 is added with a solid-to-liquid ratio controlled at $0.10\pm0.05$ g/mL. The reaction mixture is magnetically stirred for 45 min to arrive at a uniform pale-yellow solution. The reactor is sealed and placed in a program-controlled temperature oven for stepwise heating to complete the hydrothermal synthesis. Specifically, the reactor is heated to 170-190° C. (e.g. 180° C.) at a rate of about 5° C./min, and maintained at 170-190° C. for 7-9 h (e.g. 8 h) to enable the directed growth of a core of the rare-earth-doped $SrSb_xSc_{2-x}TaCl_2O_8$ precursor; then, the reactor is heated to 210-230° C. (e.g. 220° C.) at a rate of about 1° C./min, and maintained at 210-230° C. for 10-15 h (e.g. 12 h) to utilize a high-temperature and high-pressure (HTHP) environment to promote the intercalation of rare-earth ions into the $SrSb_xSc_{2-x}TaCl_2O_8$ lattice (x is controlled within a range of 0.8-1.2 to balance the polarizability of $Sc^{3+}$ and the lattice stability contributed by $Sb^{3+}$). After the hydrothermal synthesis is completed, the reactor is naturally cooled to 60° C. and opened to collect a milky-white suspension. The milky-white suspension is centrifuged at 8,000 rpm for 10 min, and the precipitate is collected, washed with deionized water three times and anhydrous ethanol three times, and dried under vacuum at 80° C. for 12 h to give the rare-earth-doped $SrSb_xSc_{2-x}TaCl_2O_8$ precursor powder having a monoclinic crystal system (with a particle size distribution ranging from 80 nm to 150 nm).

Figure 2:
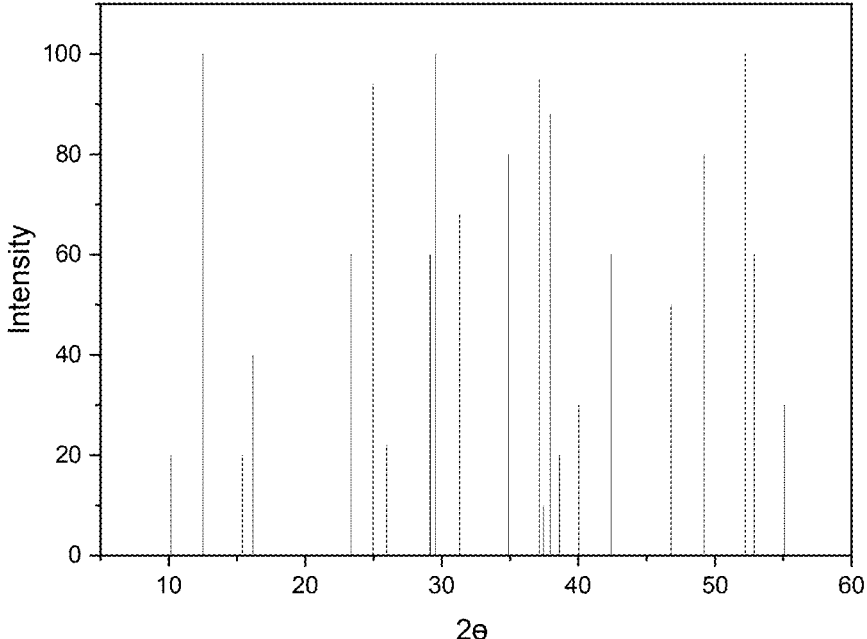
FIG. 2 is an X-ray diffraction (XRD) pattern of a $Eu^{3+}$-doped $SrSb_1Sc_1TaCl_2O_8$ precursor powder according to an embodiment of the present disclosure.
Figure 3A:
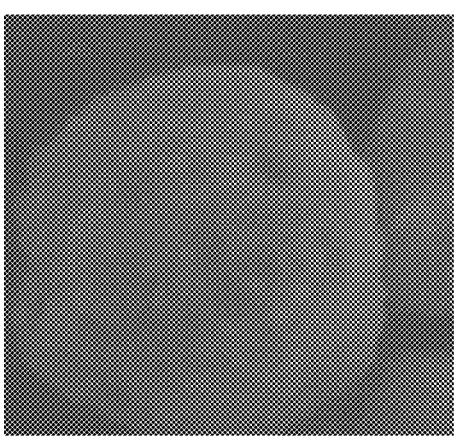
FIG. 3a is a scanning electron microscopy (SEM) image of a $Er^{3+}$-doped $SrSb_xSc_{2-x}TaCl_2O_8$ precursor powder according to an embodiment of the present disclosure.
Figure 3B:
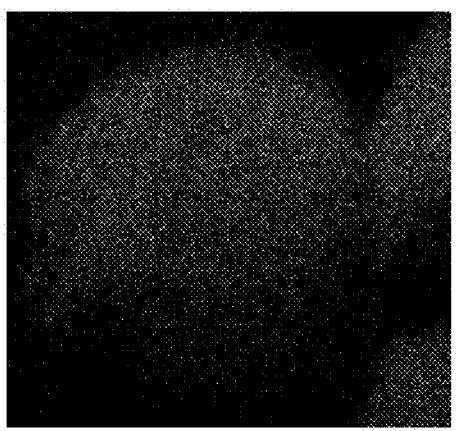
FIGS. 3b-3h show the distribution of individual elements in the $Er^{3+}$-doped $SrSb_xSc_{2-x}TaCl_2O_8$ precursor powder according to an embodiment of the present disclosure, where 3b: O; 3c: Cl; 3d: Sr; 3e: Ta; 3f: Sc; 3g: Sb; and 3h: Er.
Figure 3C:
Figure 3D:
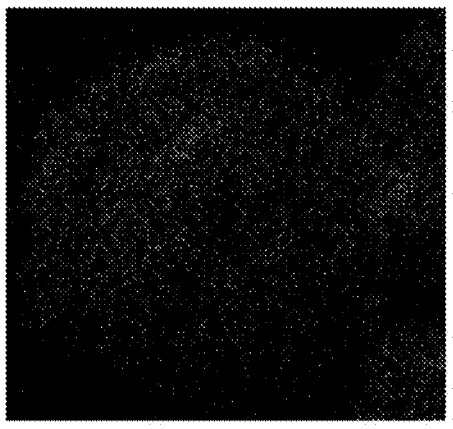
Figure 3E:
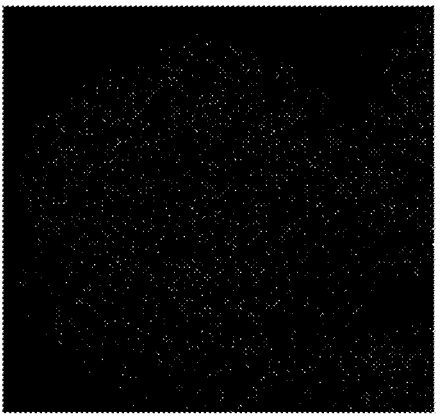
Figure 3F:
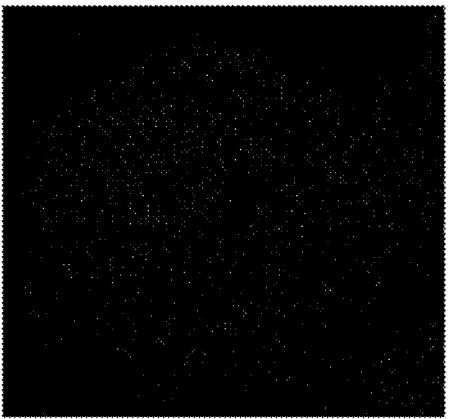
Figure 3G:
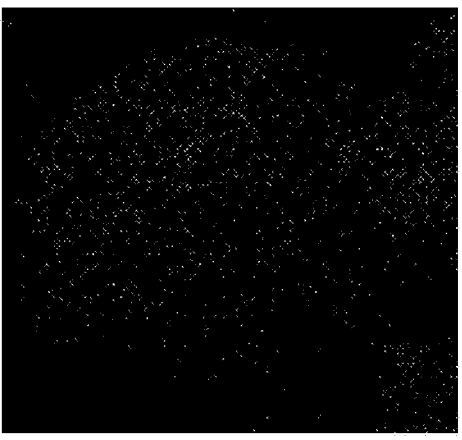
Figure 3H:
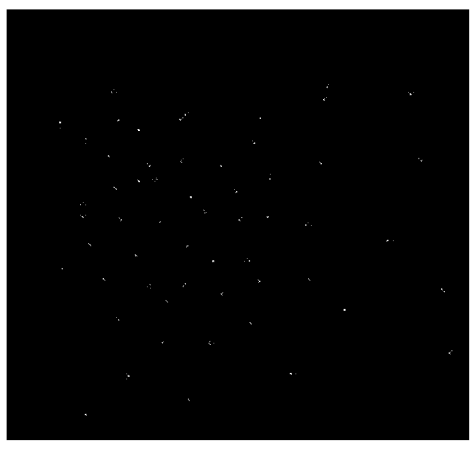

An X-ray diffraction (XRD) pattern of a $Eu^{3+}$-doped $SrSb_1Sc_1TaCl_2O_8$ precursor powder sample is shown in FIG. 2. A scanning electron microscopy (SEM) image of a $Er^{3+}$-doped $SrSb_xSc_{2-x}TaCl_2O_8$ precursor powder sample is shown in FIG. 3a, and FIGS. 3b-3h respectively show the distribution of individual elements in the $Er^{3+}$-doped $SrSb_xSc_{2-x}TaCl_2O_8$ precursor powder. As demonstrated by FIGS. 2 and 3a-h, the rare-earth ions have been successfully intercalated into the $SrSb_xSc_{2-x}TaCl_2O_8$ lattice.

Figure 5:
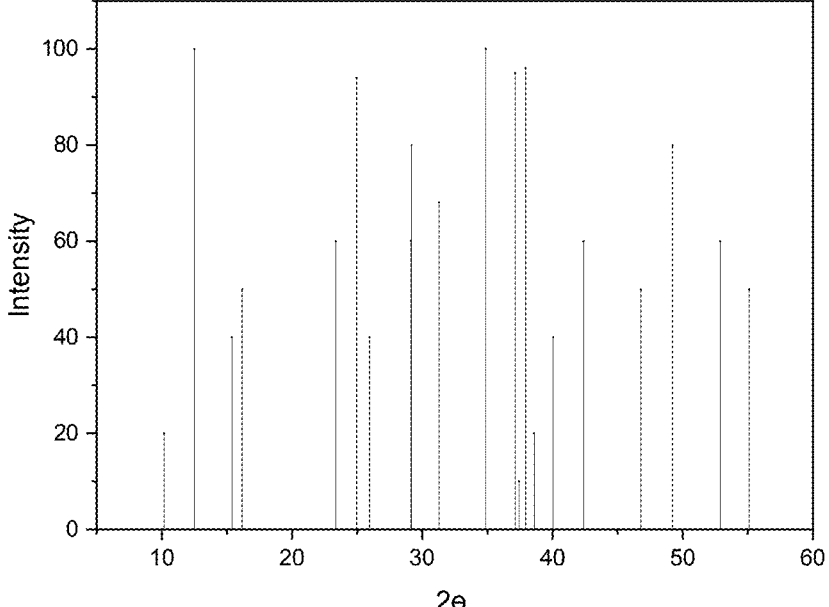
FIG. 5 is an XRD pattern of a $Yb^{3+}$-doped $SrSb_1Sc_1TaCl_2O_8$ precursor powder according to an embodiment of the present disclosure.
Figure 6:
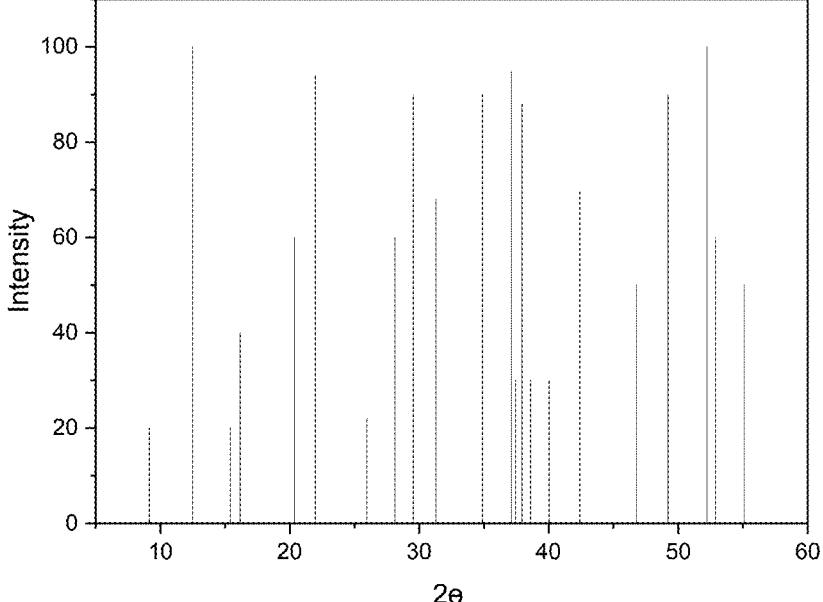
FIG. 6 is an XRD pattern of a $Tm^{3+}$-doped $SrSb_1Sc_1TaCl_2O_8$ precursor powder according to an embodiment of the present disclosure.
Figure 7:
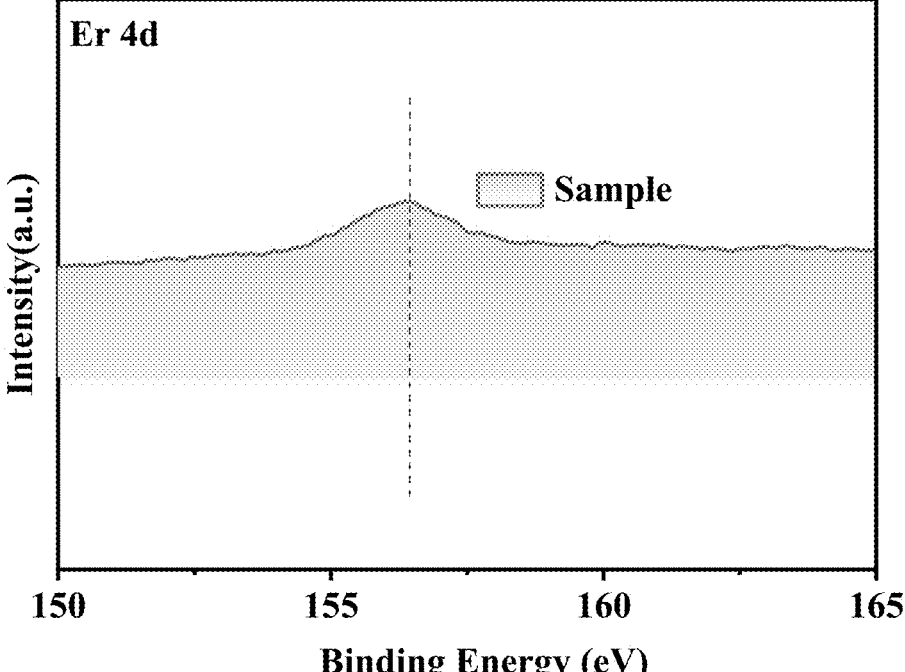
FIG. 7 is an X-ray photoelectron spectroscopy (XPS) image of the $Er^{3+}$-doped $SrSb_xSc_{2-x}TaCl_2O_8$ sample according to an embodiment of the present disclosure.
Figure 8:
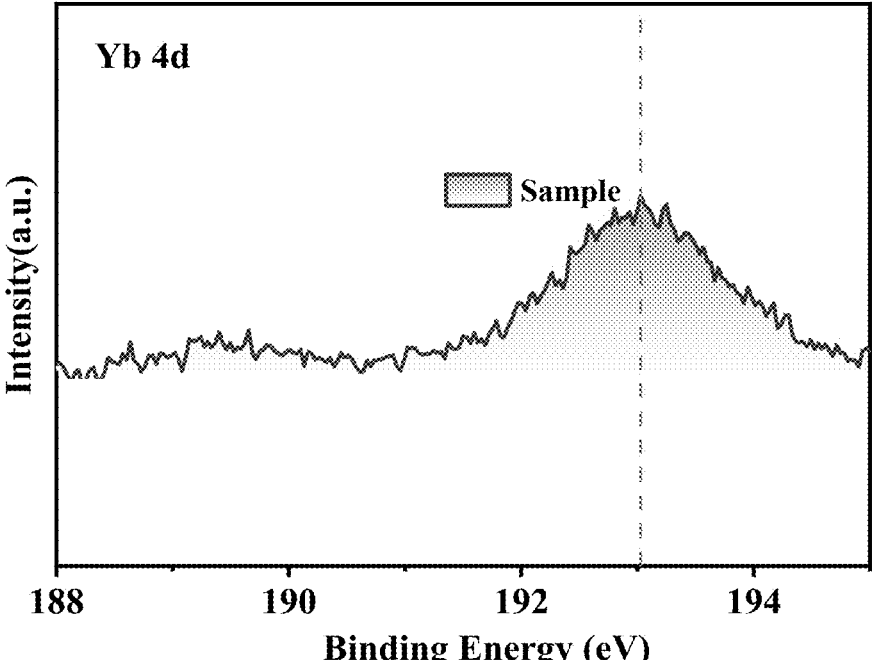
FIG. 8 is an XPS image of the $Yb^{3+}$-doped $SrSb_1Sc_1TaCl_2O_8$ sample according to an embodiment of the present disclosure.

XRD patterns of $Yb^{3+}$-doped and $Tm^{3+}$-doped $SrSb_1Sc_1TaCl_2O_8$ precursor powder samples are shown in FIGS. 5-6, respectively;

An X-ray photoelectron spectroscopy (XPS) image of a $Er^{3+}$-doped $SrSb_1Sc_{2-x}TaCl_2O_8$ sample is shown in FIG. 7. An XPS image of a $Yb^{3+}$-doped $SrSb_1Sc_1TaCl_2O_8$ sample is shown in FIG. 8. As observed from FIGS. 5-8, the rare-earth ions have been successfully intercalated into the $SrSb_xSc_{2-x}TaCl_2O_8$ lattice.

Figure 4:
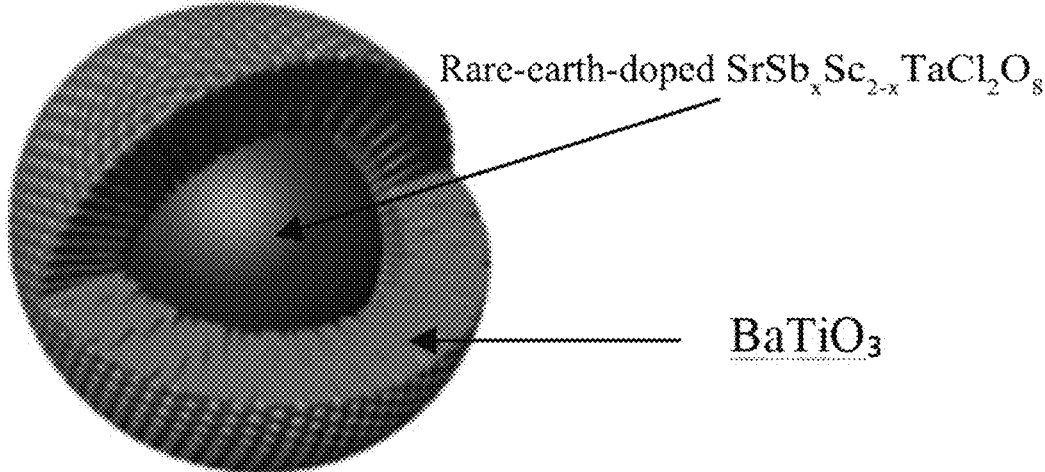
FIG. 4 schematically shows a core-shell structure of the rare-earth-doped $SrSb_xSc_{2-x}TaCl_2O_8@BaTiO_3$ according to an embodiment of the present disclosure.

Step (B) The rare-earth-doped $SrSb_xSc_{2-x}TaCl_2O_8$ precursor powder is coated with a $BaTiO_3$ shell to form core-shell nanoparticles. A core-shell structure of rare-earth-doped $SrSb_xSc_{2-x}TaCl_2O_8@BaTiO_3$ is schematically shown in FIG. 4.

In an embodiment, step (B) includes the following steps.

Step (B1) The rare-earth-doped $SrSb_xSc_{2-x}TaCl_2O_8$ precursor powder is ultrasonically dispersed in anhydrous ethanol to form a suspension.

Step (B2) A barium ion source solution and a titanium ion source solution are simultaneously dropwise added to the suspension at equal rate under mechanical stirring to trigger a directed heterogeneous nucleation.

Step (B3) The reaction product is centrifuged to obtain a precipitate, and the precipitate is calcined to form the core-shell nanoparticle. The barium ion source solution is a solution of barium acetate in ethanol, and the titanium ion source solution is a complex of tetrabutyl titanate and acetylacetone.

In some embodiments, the step (B) is specifically performed as follows. 10 g of the rare-earth-doped $SrSb_xSc_{2-x}TaCl_2O_8$ precursor powder is dispersed in 150 mL of anhydrous ethanol and ultrasonicated for 30 min to obtain the suspension. The solution of barium acetate ($Ba(CH_3COO)_2$) (0.1 M, 50 mL) in ethanol and the complex of tetrabutyl titanate ($Ti(OC_4H_9)_4$) (0.1 M, 50 mL) and acetylacetone are synchronously added to the suspension with a rate of 1.5 mL/min. The reaction mixture is adjusted to $4.0\pm0.2$ with acetic acid and continuously refluxed for 4 h under this weakly-acidic environment to induce the directional heterogeneous nucleation of $Ba^{2+}/Ti^{4+}$ on the surface of $SrSb_xSc_{2-x}TaCl_2O_8$:RE particles, resulting in the formation of an amorphous hydroxide coating. After the reaction is completed, the resultant solution is centrifuged to collect a precipitate, which is washed with anhydrous ethanol twice, heated in an alumina crucible to 550° C. at a rate of 3° C./min and calcined in an air atmosphere for 2 h. Throughout this calcination step, the amorphous hydroxide coating is converted into a $BaTiO_3$ shell with a perovskite phase (with a thickness of 10-15 nm, verified by high-resolution transmission electron microscopy (HRTEM)). Moreover, the monoclinic crystal phase of the core is retained. The $SrSb_xSc_{2-x}TaCl_2O_8$: RE@$BaTiO_3$ nanoparticles with a clear core-shell interface are finally obtained (the dielectric constant of the $SrSb_xSc_{2-x}TaCl_2O_8$: RE@$BaTiO_3$ nanoparticles is 1.8 times that of the rare-earth-doped $SrSb_xSc_{2-x}TaCl_2O_8$ precursor).

Step (C) The core-shell nanoparticles are dispersed in a polyvinylidene fluoride (PVDF) matrix to obtain a flexible lead-free piezoelectric composite film.

In an embodiment, step C includes the following steps.

Step (C1) The core-shell nanoparticles are mixed with a solution of the PVDF matrix to obtain a solid-liquid mixture.

Step (C2) The solid-liquid mixture is subjected to roll milling to obtain a slurry.

Step (C3) The slurry is subjected to tape casting to form the flexible lead-free piezoelectric composite film.

Step (C4) The flexible lead-free piezoelectric composite film is subjected to an internal stress relief treatment.

In some embodiments, step C is specifically performed as follows. 6 g of the core-shell nanoparticles are mixed with 40 g of a PVDF/NMP (N-methylpyrrolidone) solution (a 15 wt. % PVDF solution in NMP) to obtain the solid-liquid mixture. 0.5 wt. % of polyvinylpyrrolidone (PVP-K30) and 0.5-2 wt. % of azodiisobutyronitrile (AIBN) are synchronously added to the solid-liquid mixture, and served as a dispersant and an initiator, respectively. The reaction mixture is placed in a three-roll miller, and subjected to three times roll milling with a roll spacing of 20 μm to give a slurry (with a particle size distribution $D_{90}<800$ nm) of the core-shell nanoparticles dispersed in the PVDF matrix. Subsequently, the slurry is subjected to tape casting to form a polished glass substrate. The polished glass substrate is subjected to stepwise-drying process performed as follows. The slurry is heated to 80° C. for 2 h to evaporate most of the solvent, then cooled to 60° C. for 6 h to relieve an internal stress, and finally dried at 40° C. for 12 h to completely remove residual NMP solution. After the step (C) is completed, the composite film has a thickness of 100±5 μm, and a surface roughness Ra of lowering 0.2 μm (determined via an atomic force microscopy (AFM)). The cross-sectional SEM observation of the film shows that the core-shell nanoparticles forms a three-dimensional network distribution within the PVDF matrix (inter-particle spacing<200 nm). This microstructure endows the material with a high fracture elongation of 18%, while maintaining piezoelectric activity with a $d_{33}$ of 28±3 pC/N.

Figure 9:
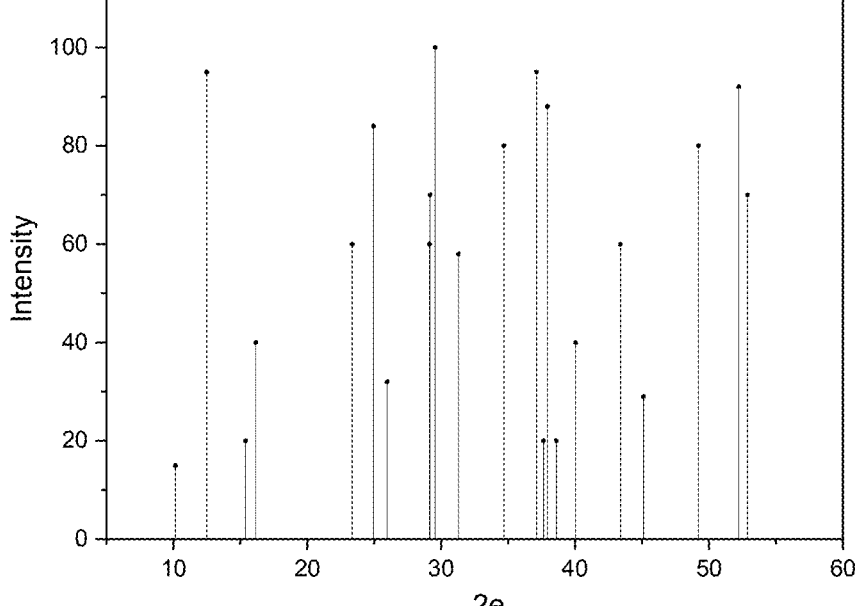
FIG. 9 is an XRD pattern of a $Er^{3+}$-doped $SrSb_xSc_{2-x}TaCl_2O_8@BaTiO_3$/polyvinylidene fluoride (PVDF) sample according to an embodiment of the present disclosure.

An XRD pattern of a $Er^{3+}$-doped $SrSb_{0.8}Sc_{1.2}TaCl_2O_8$@$BaTiO_3$/PVDF sample according to an embodiment of the present disclosure is shown in FIG. 9. As further demonstrated by FIG. 9, the rare-earth ions have been successfully intercalated into the $SrSb_xSc_{2-x}TaCl_2O_8$ lattice.

As shown herein, the present disclosure provides the method of preparing the flexible lead-free piezoelectric composite film, whose processing temperature is lower than that of other technical solutions in the prior art. For example, the nanoparticles are subjected to hydrothermal synthesis at a temperature of lowering 220° C., the nanoparticles are dispersed via an in-situ polymerization process at 60-80° C., and the aforementioned methods do not require high-temperature sintering, and have advantages of low energy consumption and highly-efficient production.

In a second aspect, the present disclosure provides a flexible lead-free piezoelectric composite film. The flexible lead-free piezoelectric composite film is prepared by the aforementioned methods. A key innovation of the flexible lead-free piezoelectric composite film lies in the design of the material, including the following aspects.

(1) $SrSb_xSc_{2-x}TaCl_2O_8$ is served as a piezoelectric substrate (where $0.8<x<1.2$) to exhibit high-voltage electrical response. By adjusting a ratio of Sb to Ta, an oxygen octahedral tilt angle is adjusted to optimize the piezoelectric performance. The layered perovskite structure exhibits the high-voltage electrical response ($d_{33}$ is 450-520 pC/N) and a high Curie temperature (>280° C.).

(2) A rare-earth element selected from the group consisting of $Eu^{3+}$, $Er^{3+}$, $Yb^{3+}$ and $Tm^{3+}$ is served as a performance enhancer. A doping amount of the rare-earth element is 0.5-5 mol %, preferably 1-3 mol %. A local lattice distortion is generated by utilizing a radius mismatch of rare-earth ions to enhance spontaneous polarization (Ps), thereby achieving a 4f electron transition to improve dielectric properties ($\varepsilon_r$=1,500-2,000, tan δ<0.02).

(3) $BaTiO_3$ is served as a core-shell material to enable interfacial modification, and a thickness of a shell part of the core-shell material is 5-50 nm, preferably 10-30 nm. Acting as a buffer layer, it can reduce interfacial energy, improve the compatibility between inorganic particles and PVDF, suppress interfacial charge accumulation, and enhance the fatigue resistance of the material.

(4) PVDF is served as a flexible substrate, and a β-crystalline phase content of the PVDF matrix is greater than 85% to provide a sufficient flexibility (with a bending radius of 5 mm), and the high β-crystalline phase content ensures a good piezoelectricity to form a continuous phase.

In a third aspect, the present disclosure provides an electronic device, including the flexible lead-free piezoelectric composite film. The electronic device is selected from the group consisting of a sprayer, a sensor and a speaker.

In an embodiment, the electronic device is an atomizer. An atomizing component includes a flexible substrate, an electrode layer, a piezoelectric functional layer and a waterproof protection layer stacked in sequence. The piezoelectric functional layer is the flexible lead-free piezoelectric composite film. The electrode layer has an interdigital electrode structure with an electrode width of 50-200 μm and an electrode spacing of 100-300 μm, and an electrode material selected from the group consisting of an indium tin oxide (ITO), a silver nanowire, a platinum mesh and a combination thereof. Such an electrode layer structure is fine and less prone to cracking compared to conventional large-area electrodes, making it suitable for the flexible devices. The flexible substrate is made of a polyimide (PI) film or a polyethylene terephthalate (PET) film. A thickness of the flexible substrate is 50-200 μm, and a surface roughness Ra of the flexible substrate is not greater than 0.1 μm. The waterproof protection layer is a nano hydrophobic coating made of a fluoropolymer material, which is selected from the group consisting of perfluoropolyether (PFPE), polytetrafluoroethylene (PTFE), fluorinated acrylate and a combination thereof. A thickness of the nano hydrophobic coating is 0.5-10 μm, preferably 1-5 μm.

In an embodiment, a water contact angle is greater than 150°, and a surface roughness Ra of the nano hydrophobic coating is not greater than 0.05 μm.

In an embodiment, the nano hydrophobic layer is formed on the surface of the piezoelectric functional layer through vapor deposition, dip coating, spin coating or spray coating.

In some embodiments, the assembled structure is subjected to thermal treatment such as 50-120° C. for 0.5-2 h, to enhance the adhesion between the coating and the substrate as well as the compactness of the nano hydrophobic coating.

Before integrating a plurality of structural layers, the atomizing component of the atomizer in the present disclosure is subjected to electric field polarization applied to the flexible lead-free piezoelectric composite film to activate the piezoelectric performance, including the following steps.

A dried PVDF-matrix composite film is placed in a silicone oil bath. A double-sided symmetrical electrode device (with both upper and lower electrodes being platinum mesh electrodes) is adopted and heated at a rate of 2° C./min to 90-100° C. (close to the glass transition temperature of PVDF but lower than the Curie temperature of the core-shell nanoparticles). A direct current (DC) polarized electric field of 80-120 kV/cm is applied for 30-60 min at a stable temperature. Subsequently, the PVDF-matrix composite film is slowly cooled to below 40° C. at a rate of 0.5-1° C./min while maintaining the DC polarized electric field of 80-120 kV/cm, and taken out after removing the DC polarized electric field. This graded temperature field polarization process not only significantly improves the piezoelectric coefficient ($d_{33} \geq 25$ pC/N) but also prevents thermal stress-induced lattice defects in the composite film.

The atomizing component described in the present disclosure is a planar annular piezoelectric vibrator, and the specific structure thereof is well-known to those skilled in the art.

In order to make the atomizing component described in the present disclosure have better performance, the structure and fabrication of the atomizing component are designed and/or treated through the following steps.

(1) The polarized flexible lead-free piezoelectric composite film is cut into a circular piece with a diameter of 20 mm as a core piezoelectric vibrator. A surface of the core piezoelectric vibrator is washed with plasmas. A gold electrode with a thickness of 100 nm is deposited on both sides of the film using a magnetron sputtering technology, with a 2 mm insulated margin preset at the electrode edges. Subsequently, the core piezoelectric vibrator is assembled into a specially-designed flexible polymer cavity (made of polydimethylsiloxane (PDMS) with a thickness of 1.5 mm).

(2) A vibrator mounting layer is prepared through the following steps. A hole (with a diameter of 18 mm) is drilled at a bottom of the PDMS cavity. The vibrator is embedded such that the gold electrode surface is flush with the bottom of the PDMS cavity. The bottom electrode is connected to the copper wire pre-embedded in the PDMS cavity by using epoxy conductive adhesive (with a silver content of 70%).

(3) A waterproof breathable membrane is integrated through the following steps. A hydrophobic nanofiber membrane (made of PTFE, with a pore size of 0.22 μm) is covered over the vibrator. The edges are sealed with a thermal compression ring to form an atomizing liquid chamber (with a height of 3 mm).

In an embodiment, when a voltage is applied by the circuit, the composite film is subjected to a thickness-direction vibration, and water molecules are torn into micron-sized droplets ($D_{50}=2.8$ μm) in a liquid chamber via the cavitation effect. The hydrophobic membrane prevents liquid from penetrating into the electrode layer, while the low Young's modulus (0.5-1 MPa) of the PDMS cavity absorbed vibration recoil forces, avoiding brittle fracture. The measured atomization efficiency reaches 350 mL/h·W (superior to that of conventional PZT atomizer 280 mL/h·W), and the lead-free material complies with the restriction of the use of certain hazardous substances directive (RoHS directive). This atomizing component has advantages of highly-efficient atomization, low energy consumption, environmental friendliness, and excellent flexibility, making it suitable for broad applications in skin care, medical health, environmental humidification, agricultural spraying, and other fields.

To objectively evaluate the performance of the atomizing component disclosed herein, comparative tests are performed against existing lead-containing (Pb(Zr$_{1-x}$Ti$_x$)O$_3$, PZT) atomizing components and conventional lead-free atomizing components across a plurality of key properties. All the following performance parameters are obtained by measuring independent atomizing components using standard instruments and methods recognized in the art, with specific techniques being well-known to those skilled in the art. The comparative results are shown in Table 1.

TABLE 1

| The performance comparison of different atomizers | | | |
|---|---|---|---|
| Properties | PZT atomizer | Conventional lead-free atomizer | Atomizer of the present disclosure |
| Piezoelectric constant $d_{33}$ (pC/N) | 400-600 | 200-300 | 450-520 |
| Electromechanical conversion efficiency | 60-70% | 65-75% | ≥85% |
| Working energy consumption (W) | 20-40 | 15-30 | ≤15 |
| Atomization efficiency | 70-80% | 75-85% | ≥85% |
| Lead content | >60% | 0% | 0% |
| Bending radius | >50 mm | >20 mm | <5 mm |
| Service life (h) | 3,000-4,000 | 4,000-5,000 | >5,000 |
| Droplet size $D_{50}$ (μm) | 5-10 | 4-8 | 2-5 |

The piezoelectric constant $d_{33}$ of the atomizing component disclosed herein is preferably determined via a Berlincourt $d_{33}$ Meter, approximately within a range of 450-520 pC/N. This value is significantly superior to those of the conventional lead-free atomizing components (about 200-300 pC/N), and comparable to those of high-performance lead-containing PZT components (about 400-600 pC/N), indicating that the present invention exhibits an excellent piezoelectric activity while being lead-free.

The electromechanical conversion efficiency of the atomizing component disclosed herein is determined and calculated via an impedance analyzer (e.g. Keysight E4990A) combined with a laser doppler vibrometer (LDV) (preferably, Polytec MSA-500). The atomizing component disclosed herein has an electromechanical conversion efficiency of not less than 85%, outperforming the conventional lead-free components (about 65-75%) and the lead-containing PZT components (about 60-70%). The high electromechanical conversion efficiency means that electrical energy is effectively conveyed into mechanical vibration energy, instead of being dissipated in the form of heat energy.

Under a rated operating frequency and voltage, the working energy consumption of the atomizing component disclosed herein is determined via a power analyzer (Hioki PW3390), not being greater than 15 W. This energy consumption level is lower than those of the conventional lead-free components (about 15-30 W) and the lead-containing PZT components (about 20-40 W), indicating a higher energy efficiency.

The atomization efficiency was given by determining a weight of nebulized liquid (using a precision balance) and a total output of electrical energy (using a power analyzer) within a unit of time. The atomization efficiency of the atomizing component disclosed herein is not less than 85%, outperforming the conventional lead-free components (about 75-85%) and the lead-containing PZT components (about 70-80%).

It is proved via an X-ray fluorescence spectrometer (XRF) that the lead content is 0% in a piezoceramic material of the atomizing component disclosed herein (i.e. not contain intentionally added lead), complying with the RoHS directive. The lead content of the atomizing component disclosed herein is consistent with those of the conventional lead-free components, and different from those of the lead-containing PZT components (>60%).

The atomizing component disclosed herein exhibits an excellent mechanical flexibility. A minimum bending radius thereof is determined via a flexural fatigue testing machine, reaching to 5 mm or less. This value is significantly less than those of the conventional lead-free components (>20 mm) and the lead-containing PZT components (>50 mm), making it highly suitable for applications requiring flexible or wearable devices.

It is calculated via an accelerated aging life test that the atomizing component disclosed herein has a service life of exceeding 5,000 h under normal working conditions. The service life thereof is longer than those of the conventional lead-free components (about 4,000-5,000 h) and the lead-containing PZT components (about 3,000-4,000 h), indicating a higher reliability.

The droplet size $D_{50}$ of the atomizing component disclosed herein is determined via a laser diffraction particle size analyzer (preferably Malvern Spraytec), within a range of 2-5 μm. This droplet size distribution is smaller than those of the conventional lead-free components (4-8 μm) and the lead-containing PZT components (5-10 μm). Smaller droplet sizes are crucial in some applications, such as pulmonary drug delivery, since facilitating improving bioavailability.

The atomizing component can be applied in the following fields.

In the field of healthcare, the atomizing component enables the design of portable atomization drug delivery device for treating respiratory diseases such as asthma and chronic obstructive pulmonary disease (COPD). With a droplet size of 2-5 μm, the medication can reach deep into the alveoli. It also supports skin wound repair by atomizing bioactive substances like growth factors and antibacterial agents to accelerate healing. Additionally, it can be applied in oral treatments to precisely nebulize anesthetics and anti-inflammatory drugs, minimizing systemic side effects.

In a field of domestic environment, the atomizing component can be designed into a highly-efficient humidifier, which achieves an atomization efficiency of exceeding 85% and an energy consumption of lowering 15 W, making it suitable for prolonged use. It can also be implemented in aroma diffusers to uniformly nebulize essential oil molecules while preserving the integrity of active ingredients. Furthermore, it can be utilized in air purification systems to disperse antibacterial and deodorizing agents, effectively improving indoor air quality.

In a field of agricultural production, the atomizing component can be designed into a precision pesticide sprayer with a controllable droplet size of 20-100 μm to reduce pesticide usage by 30-50%. It can also be configured for a greenhouse humidification system that achieve uniform atomization while preventing leaf surface condensation, thereby reducing disease incidence. Furthermore, it can be adapted for crop foliar fertilization devices to enhance nutrient absorption efficiency and minimize soil pollution.

In a field of industrial manufacture, the atomizing component can be designed into surface coating systems that nebulize a nano-coating to form a uniform thin film (with a thickness of 1-10 μm). It can also be configured for microelectronic cooling devices that directionally atomize coolants for targeted high-efficiency heat dissipation. Furthermore, it can be adapted for 3D printing equipment as a precision deposition device for functional materials.

In a field of scientific research instruments, the atomizing component can be designed for mass spectrometry sampling by atomizing sample solutions to enhance ionization efficiency. It can also be integrated as an atomization unit in microfluidic chips for microscale sample processing. Furthermore, it can be applied in aerosol research to generate monodisperse aerosols with a relative standard deviation (RSD) of droplet sizes (<8%).

The embodiments will be described in detail below to enable those skilled in the art to better understand the technical solutions of the present disclosure.

Embodiment 1 Preparation and Testing of $Eu^{3+}$-Doped $SrSb_1Sc_1TaCl_2O_8@BaTiO_3$/PVDF Material In a glovebox with an argon atmosphere, 5.316 g of $Sr(NO_3)_2$, 5.714 g of $SbCl_3$, 6.902 g of $Sc(NO_3)_3 \cdot 6H_2O$, 7.811 g of $TaCl_5$, and 0.223 g of $Eu(NO_3)_3 \cdot 6H_2O$ (corresponding to a doping amount of 2 mol %) were weighted. The raw materials were transferred into a reactor with a PTFE liner, and then 200 mL of a mixture of ethylene glycol and water in a volume ratio of 3:1 was added. The reaction mixture was magnetically stirred for 45 min to arrive at a pale-yellow transparent solution. The reactor was sealed and placed in a program-controlled temperature oven for stepwise heating to complete the hydrothermal synthesis. Specifically, the reactor was heated to 180° C. at a rate of 5° C./min and maintained at 180° C. for 8 h; then the reactor was heated to 220° C. at a rate of 1° C./min, and maintained at 220° C. for 12 h. After the hydrothermal synthesis was completed, the reactor was naturally cooled to 60° C. and opened to collect a milky-white suspension. The milky-white suspension was centrifuged at 8,000 rpm for 10 min, and the precipitate was collected, washed with deionized water three times and anhydrous ethanol three times, and dried under vacuum at 80° C. for 12 h to give $Eu^{3+}$-doped $SrSb_1Sc_1TaCl_2O_8$ precursor powder.

An XRD pattern of a $Eu^{3+}$-doped $SrSb_1Sc_1TaCl_2O_8$ precursor powder sample according to an embodiment of the present disclosure was shown in FIG. 2. 10 g of the $Eu^{3+}$-doped $SrSb_1Sc_1TaCl_2O_8$ precursor powder was dispersed in 150 mL of anhydrous ethanol and ultrasonicated for 30 min to obtain the suspension. The solution of barium acetate $(Ba(CH_3COO)_2)$ (0.1 M, 50 mL) in ethanol and the complex of tetrabutyl titanate $(Ti(OC_4H_9)_4)$ (0.1 M, 50 mL) and acetylacetone were synchronously added to the suspension. The reaction mixture was adjusted to pH=4.0±0.2 and continuously refluxed at 70° C. for 4 h. After the reaction was completed, the resultant solution was centrifuged to collect a precipitate, which was calcined at 550° C. for 2 h to give 6 g of core-shell nanoparticles. Finally, 6 g of the core-shell nanoparticles was mixed with 40 g of the PVDF/NMP solution (a 15 wt. % PVDF solution in NMP) to give a solid-liquid mixture. The solid-liquid mixture was subjected to three times roll milling in a three-roll miller with a roll spacing of 20 μm to give a slurry. The slurry was subjected to tape casting to form a film.

The film was subjected to stepwise-drying process (80° C./2 h→60° C./6 h→40° C./12 h) to give a composite film with a thickness of 100 μm. The composite film was subjected to piezoelectric tests, indicating $D_{33}$=490±12 pC/N, k=0.81, and a c-axis elongation of 0.23% after poling at 10 kV/mm. Atomization performance tests (1.8 MHz, 60 Vpp) was performed at 1.8 MHz and 60 Vpp, indicating normal saline had a droplet size $D_{50}$ of 3.22 μm, RSD=7.4%, and an atomization efficiency of 85.4%.

Embodiment 2 Preparation and Testing of $Er^{3+}$-Doped $SrSb_{1.2}Sc_{0.8}TaCl_2O_8@BaTiO_3$/PVDF Material In a glovebox with an argon atmosphere, 5.316 g of $Sr(NO_3)_2$, 5.714 g of $SbCl_3$, 6.902 g of $Sc(NO_3)_3 \cdot 6H_2O$, 7.811 g of $TaCl_5$, and 0.221 g of $Er(NO_3)_3 \cdot 5H_2O$ (corresponding to a doping amount of 3 mol %) were weighted. The raw materials were transferred into a reactor with a PTFE liner, and then 200 mL of a mixture of ethylene glycol and water in a volume ratio of 3:1 was added. The reaction mixture was magnetically stirred for 45 min to arrive at a pale-yellow solution. The reactor is sealed and placed in a program-controlled temperature oven for stepwise heating to complete the hydrothermal synthesis. Specifically, the reactor was heated to 180° C. at a rate of 5° C./min and maintained at 180° C. for 8 h; then, the reactor was heated to 220° C. at a rate of 1° C./min, and maintained at 220° C. for 12 h. After the hydrothermal synthesis was completed, the reactor was naturally cooled to 60° C. and opened to collect a milky-white suspension. The milky-white suspension was centrifuged at 8,000 rpm for 10 min, and the precipitate is collected, washed with deionized water three times and anhydrous ethanol three times, and dried under vacuum at 80° C. for 12 h to give a $Er^{3+}$-doped $SrSb_{1.2}Sc_{0.8}TaCl_2O_8$ precursor powder.

10 g of the $Er^{3+}$-doped $SrSb_{1.2}Sc_{0.8}TaCl_2O_8$ precursor powder dispersed in 150 mL of anhydrous ethanol and ultrasonicated for 30 min to obtain the suspension. The solution of barium acetate $(Ba(CH_3COO)_2)$ (0.1 M, 50 mL) in ethanol and the complex of tetrabutyl titanate (Ti $(OCH_9)_4)$ (0.1 M, 50 mL) and acetylacetone were synchronously added to the suspension. The reaction solution was adjusted to pH=4.0±0.2 and continuously refluxed at 70° C. for 4 h. After the reaction was completed, the resultant solution was centrifuged to collect a precipitate, which was calcined at 550° C. for 2 h to give 6 g of core-shell nanoparticles. Finally, 6 g of the core-shell nanoparticles was mixed with 40 g of the PVDF/NMP solution (a 15 wt. % PVDF solution in NMP) to give a solid-liquid mixture. The solid-liquid mixture was subjected to three times roll milling in a three-roll miller with a roll spacing of 20 μm to give a slurry. The slurry was subjected to tape casting to form a film. The film was subjected to the stepwise-drying process (80° C./2 h→60° C./6 h→40° C./12 h) to give a composite film of $Er^{3+}$-doped $SrSb_{1.2}Sc_{0.8}TaCl_2O_8@BaTiO_3$/PVDF with a thickness of 100 μm. The composite film was subjected to piezoelectric tests, indicating $D_{33}$=500±12 pC/N.

As known from the piezoelectric tests, unique relaxation behaviors were shown in a dielectric spectroscopy, such as significant interfacial polarization contributions at a low-frequency range ($<10^2$ Hz), and dominant dipole orientation at a mid-frequency range ($10^2$-$10^5$ Hz), with a relative permittivity $\varepsilon_r$=1750 and a loss tangent tan δ=0.019 at 1 KHz. It was shown in nanoindentation tests that a hardness of 0.96 GPa, an elastic modulus of 10.2 GPa, and a creep index of n=2.3.

In a clinical trial involving chronic obstructive pulmonary disease (COPD) patients, budesonide achieved a lung deposition rate of 72.5% and improved a forced expiratory volume (FEV1) by 28.7%, demonstrating significantly superior to conventional atomizers (P<0.01).

Embodiment 3 Preparation and Testing of $Yb^{3+}$-Doped $SrSb_{0.8}Sc_{1.2}TaCl_2O_8@BaTiO_3$/PVDF material In a glovebox with an argon atmosphere, 5.316 g of $Sr(NO_3)_2$ (25 mmol), 4.562 g of $SbCl_3$ (20 mmol), 9.907 g of $Sc(NO_3)_3 \cdot 6H_2O$ (29.4 mmol), 7.811 g of $TaCl_5$ (25 mmol), and 0.223 g of $Yb(NO_3)_3 \cdot 5H_2O$ (0.6 mmol) (corresponding to a doping amount of 2 mol %) were weighted. The raw materials were transferred into a reactor with a PTFE liner (500 mL), and then 200 mL of a mixture of glycerol and water in a volume ratio of 4:1 was added. The reaction mixture was magnetically stirred for 60 min to arrive at a blue-green transparent solution. The reactor is sealed and placed in a program-controlled temperature oven for stepwise heating to complete the hydrothermal synthesis. Specifically, the reactor was heated to 200° C. at a rate of 3° C./min and maintained at 200° C. for 15 h. After the hydrothermal synthesis was completed, the reactor was naturally cooled to 50° C. and opened to collect a pale-green suspension. The pale-green suspension was centrifuged at 7,500 rpm for 12 min, and the precipitate is collected, washed with 0.1 M dilute nitric acid twice, deionized water twice and isopropanol twice, and dried under vacuum at 85° C. for 10 h to give $Yb^{3+}$-doped $SrSb_{0.8}Sc_{1.2}TaCl_2O_8$ precursor powder.

8 g of the $Yb^{3+}$-doped $SrSbSc_{1.2}TaCl_2O_8$ precursor powder was dispersed in 120 mL of anhydrous ethanol and ultrasonicated for 40 min to obtain the suspension. The solution of barium acetate $(Ba(CH_3COO)_2)$ (0.15 M, 40 mL) in ethylene glycol (0.15 M, 40 mL) and the complex of tetrabutyl titanate $(Ti(OC_4H_9)_4)$ (0.15 M, 40 mL) and ethyl acetoacetate are synchronously added to the suspension. The reaction solution was maintained at pH=4.5±0.2 with ammonium hydroxide and continuously refluxed at 65° C. for 5 h. After the reaction is completed, the resultant solution was centrifuged to collect a precipitate, which was subjected to a stepwise-calcining process (300° C./1 h→500° C./2 h) to give 5 g of core-shell nanoparticles. Finally, 5 g of the core-shell nanoparticles was mixed with 35 g of the PVDF/DMF solution (an 18 wt. % PVDF solution in DMF) to give a solid-liquid mixture. The solid-liquid mixture was subjected to milling in a double-screw extruder at 180° C. for 100 rpm to give a slurry. The slurry was subjected to tape casting to form a film. The film was subjected to hot-press molding at 190° C. for 8 min under 10 MPa to give a $Yb^{3+}$-doped $SrSb_{0.8}Sc_{1.2}TaCl_2O_8@BaTiO_3$/PVDF composite film with a thickness of 120 μm.

The composite film was subjected to piezoelectric tests. It was shown in a quasi-static $d_{33}$ testing that the composite film had a piezoelectric coefficient of 503±15 pC/N and an electromechanical coupling coefficient k of 0.79. By poling under a 12 T strong magnetic field, the crystal's c-axis elongation reached 0.31%, and the loss tangent (tan δ) decreased to 0.018 (at 1 kHz). It was shown in an impedance analysis (1 kHz-10 MHz) that the composite film had a resonant frequency of 1.92 MHz and a mechanical quality factor of Q=225.

The composite film was applied to an e-cigarette atomizer for atomization performance testing. Under 2.1 MHz/65 Vpp driving conditions, a nicotine salt solution (50 mg/mL) was nebulized through the e-cigarette atomizer to achieve a droplet size $D_{50}$ of 0.82 μm with RSD=5.3%. It was shown in a high-speed imaging that the e-cigarette atomizer a spray cone angle of 28.5° and an aerosol velocity of 2.8 m/s. GC-MS analysis showed undetectable formaldehyde, acetaldehyde at 2.1 ng/puff, and acrolein at 1.2 ng/puff, representing a 98% reduction compared to conventional resistance heating atomization. The nicotine lung deposition rate reached 72.5% with merely 15.3% oropharyngeal residue.

Embodiment 4 Preparation and Testing of $Tm^{3+}$-Doped $SrSb_{1.5}Sc_{0.5}TaCl_2O_8$@$BaTiO_3$/PVDF Material In a glovebox with an nitrogen atmosphere, 5.316 g of $Sr(NO_3)_2$ (25 mmol), 8.554 g of $SbCl_3$ (37.5 mmol), 4.128 g of $Sc(NO_3)_3 \cdot 6H_2O$ (12.25 mmol), 7.811 g of $TaCl_5$ (25 mmol), and 0.107 g of $Tm(NO_3)_3 \cdot 5H_2O$ (0.25 mmol) (corresponding to a doping amount of 2 mol %) were weighted. The raw materials were transferred into a quartz reactor, and then 150 mL of a mixture of ethanolamine and water in a volume ratio of 1:1 was added. The reaction mixture was magnetically stirred for 50 min to arrive at a purple-red transparent solution. The reactor is sealed and placed in a microwave reactor (CEM Mars6). Parameters were set to a power of 600 W, a temperature of 230° C., a pressure of 4 MPa, and a reaction time of 45 min, respectively. After the hydrothermal synthesis was completed, the reactor was cooled to 80° C. by air-cooling and opened to give a pale-purple suspension. The pale-purple suspension was filtered under vacuum, washed with a mixture solution of ethanol and acetone in a volume ratio of 1:1 three times, and dried under vacuum at 90° C. for 8 h to give a $Tm^{3+}$-doped $SrSb_{1.5}Sc_{0.5}TaCl_2O_8$ precursor powder.

7 g of the $Tm^{3+}$-doped $SrSb_{1.5}Sc_{0.5}TaCl_2O_8$ precursor powder was dispersed in 100 mL of isopropanol, followed by adding a silane coupling agent (KH-570) of 0.5 mL and ultrasonicated for 35 min to obtain the suspension. The solution of barium nitrate ($Ba(NO_3)_2$) (0.2 M, 35 mL) in methanol and the complex of tetraethyl orthotitanate (Ti$(OC_2H_3)_4$) (0.2 M, 35 mL) and citric acid are synchronously added to the suspension. The reaction mixture was adjusted to pH=3.8±0.1 and continuously refluxed at 75° C. for 6 h. After the reaction is completed, the resultant solution was centrifuged to collect a precipitate, which was subjected to stepwise-calcining process (150° C./1 h→350° C./1 h→600° C./2 h) to give 4.5 g of core-shell nanoparticles. Finally, 4.5 g of the core-shell nanoparticles was mixed with 30 g of the PVDF/Acetone solution (a 20 wt. % PVDF solution in acetone) to give a solid-liquid mixture. The solid-liquid mixture was subjected to electrospinning process to form a nanofiber membrane. The electrospinning process was performed at a voltage of 25 kV, a collecting distance of 15 cm, and a flow rate of 1.2 mL/h. After the electrospinning process was completed, the nanofiber membrane was subjected to thermal annealing at 80° C. for 2 h to give a $Tm^{3+}$-doped $SrSb_{1.5}Sc_{0.5}TaCl_2O_8$@$BaTiO_3$/PVDF composite film with a thickness of 80 μm.

The composite film was subjected to piezoelectric tests. A high-voltage hysteresis loop of 20 Hz revealed a remanent polarization ($P_r$) of 7.2 μC/cm² and a coercive field ($E\square$) of 28 MV/m. The piezoelectric coefficient $d_{33}$ reached 487±14 pC/N, with less than 4.5% degradation after 109 electrical cycles. In-situ XRD analysis confirmed a 0.19% expansion in the (002) interplanar spacing after poling, along with an enhanced crystal orientation degree increasing to 0.92 from an initial value of 0.78.

The composite film was applied to an industrial coating atomizer for spray performance testing. By setting a $D_{50}$ of 38 μm, a particle size distribution of a waterborne polyurethane paint (45% solid content) was measured with a RSD of 6.8%. Film thickness uniformity reached ±0.9 μm over a 1 m² substrate, with a distinctness of image (DOI) of 93. The paint achieved a utilization of 88% and was reduced (volatile organic compounds) VOC emissions to 25 g/m² via an electrostatic assistance (15 kV). After 2,000 hours of aging by a Q-U-V accelerated weathering tester (QUV), the paint had a color difference of ΔE<0.8 (an industry standard of ΔE<2.0).

The composite film had the following optical characteristics. Under 980 nm laser excitation, the composite film exhibited intense blue emission at 476 nm ($^1G_4 \rightarrow {}^3H_6$ transition) with a quantum yield of 22%. The composite film had a two-photon absorption cross-section of $3.0 \times 10^{-20}$ cm⁴/GW, a fluorescence lifetime of 1.92 ms, and a Coherent Infrared Energy (CIE) chromaticity coordinates of (0.152, 0.031) complied with requirements for D65 standard white light.

Embodiment 5 Optimization Test of Sb Content (x=0.2–1.8)

The optimization test was performed as follows. Under conditions of a doping element of $Eu^{3+}$ and a doping amount of 2 mol %, a series of samples (x=0.2, 0.5, 1.0, 1.5 and 1.8) were prepared. The base powders were prepared by the hydrothermal synthesis, sol-gel coated by $BaTiO_3$ with a thickness of 20 nm, and composited with PVDF.

Analysis of the optimization test of Sb content (x=0.2–1.8)

| x | $d_{33}$(pC/N) | k (%) | Atomization efficiency (%) | Curie temperature (° C.) |
|---|---|---|---|---|
| 0.2 | 385 | 68 | 76 | 295 |
| 0.5 | 453 | 73 | 82 | 289 |
| 1.0 | 503 | 79 | 87 | 285 |
| 1.5 | 472 | 75 | 83 | 278 |
| 1.8 | 425 | 70 | 78 | 272 |

It was shown in the above table that when x was 1.0, the core-shell nanoparticles with a ratio of Sb/Ta achieved an optimal performance with an oxygen octahedral tilt angle of 45°, maximizing the piezoelectric response. An excessive content of Sb (x>1.0) caused an increased oxygen vacancy concentration and an elevated dielectric loss, while an excessive content of Ta (x<1.0) caused a diminished lattice distortion and piezoelectric performance.

Embodiment 6 Influence Test of a Thickness of a Shell Part (5-50 nm)

The influence test was performed as follows. A shell thickness was controlled by adjusting a concentration of tetrabutyl titanate solution. A series concentration of tetrabutyl titanate solutions were prepared (i.e. [Ti]=0.1, 0.5, 1.0, and 2.0 mmol/ml), corresponding to four group samples with different shell thicknesses (5, 15, 30, and 50 nm, respectively).

Performance Test

| Shell thickness (nm) | $d_{33}$ (pC/N) | Fatigue resistance ($10^6$ times) | Interface bonding strength (MPa) |
| --- | --- | --- | --- |
| 5 | 475 | −15% | 18.2 |
| 15 | 490 | −8% | 24.5 |
| 30 | 485 | −5% | 26.8 |
| 50 | 455 | −18% | 15.7 |

It was shown in the above table that a shell part with a thickness of 15-30 nm exhibited an optimal stress transfer efficiency. The shell part with a thickness of lowering 10 nm could not effectively buffer a thermal mismatch stress, while the shell part with a thickness of exceeding 40 nm could generate stress transfer, resulting in fracture failures. The interface bonding strength of the shell part with a thickness of 30 nm was improved by 47% than that of the shell part with a thickness of 5 nm.

It should be noted that all embodiments include complete preparation process parameters, structural characterization methods, performance test data, and practical application effects to forming a rigorous technical closed loop. Through systematic study of characteristic differences among various material systems and targeted optimization based on specific application requirements, the innovation and practicality of the present disclosure are fully demonstrated.

The aforementioned embodiments are not intended to limit the scope of the present disclosure. It should be understood that various modifications, combinations, sub-combinations, and substitutions can be made by those skilled in the art with depending on design requirements and other factors. Any modifications, equivalent replacements, and improvements made within the spirit and principle of the present disclosure shall fall within the scope of the present disclosure defined by the appended claims.

What is claimed is:

1. A method of preparing a flexible lead-free piezoelectric composite film, comprising:
(A) preparing a $SrSb_xSc_{2-x}TaCl_2O_8$ precursor powder doped with a rare-earth element, wherein $0.8<x<1.2$;
(B) coating the $SrSb_xSc_{2-x}TaCl_2O_8$ precursor powder with a shell to form a core-shell nanoparticle, wherein shell is made from $BaTiO_3$; and
(C) dispersing the core-shell nanoparticle in a polyvinylidene fluoride (PVDF) matrix to obtain the flexible lead-free piezoelectric composite film.

2. The method according to claim 1, wherein in step (A), the rare-earth element is a lanthanide element.

3. The method according to claim 1, wherein step (A) comprises:
(A1) weighing $Sr(NO_3)_2$, $SbCl_3$, $Sc(NO_3)_3 \cdot 6H_2O$, $TaCl_5$ and a rare earth nitrate based on a stoichiometric ratio, and dissolving $Sr(NO_3)_2$, $SbCl_3$, $Sc(NO_3)_3 \cdot 6H_2O$, $TaCl_5$ and the rare earth nitrate in a polar solvent to obtain a mixture solution;
(A2) subjecting the mixture solution to hydrothermal synthesis in a sealed container, and cooling to obtain an intermediate product; and
(A3) subjecting the intermediate product to centrifugation, washing and drying to obtain the $SrSb_xSc_{2-x}TaCl_2O_8$ precursor powder doped with the rare-earth element.

4. The method according to claim 3, wherein in step (A1), the rare earth nitrate is selected from the group consisting of $Eu(NO_3)_3 \cdot 6H_2O$, $Er(NO_3)_3 \cdot 5H_2O$, $Yb(NO_3)_3 \cdot 4H_2O$, $Tm(NO_3)_3 \cdot 4H_2O$ and a combination thereof, and a total molar amount of the rare-earth element is 0.5-5.0% of a molar amount of Sr in the $SrSb_xSc_{2-x}TaCl_2O_8$ precursor powder.

5. The method according to claim 3, wherein in step (A1), the polar solvent is a mixture of ethylene glycol and water in a volume ratio of 2-4:1, and a solid-to-liquid ratio for dissolution is $0.10\pm0.05$ g/mL.

6. The method according to claim 3, wherein the step (A2) is performed through steps of:
heating the mixture solution to 170-190° C. at a rate of 5° C./min followed by holding at 170-190° C. for 7-9 h;
heating the mixture solution to 210-230° C. at a rate of 1° C./min followed by holding at 210-230° C. for 10-15 h; and
naturally cooling the mixture solution to 60° C.

7. The method according to claim 1, wherein step (B) comprises:
(B1) ultrasonically dispersing the $SrSb_xSc_{2-x}TaCl_2O_8$ precursor powder in an anhydrous ethanol to form a suspension of the $SrSb_xSc_{2-x}TaCl_2O_8$ precursor powder;
(B2) simultaneously dropwise adding a barium ion source solution and titanium ion source solution at an equal rate to the suspension under mechanical stirring, followed by directed heterogeneous nucleation to achieve a shell-coating treatment, so as to obtain an intermediate product; and
(B3) subjecting the intermediate product to centrifugation to collect a precipitate, and calcining the precipitate to form the core-shell nanoparticle.

8. The method according to claim 7, wherein the barium ion source solution is a solution of barium acetate in ethanol; and the titanium ion source solution is a complex of tetrabutyl titanate and acetylacetone.

9. The method according to claim 1, wherein step (C) comprises:
(C1) mixing the core-shell nanoparticle with a solution of the PVDF matrix to obtain a solid-liquid mixture;
(C2) subjecting the solid-liquid mixture to roll milling to obtain a slurry; and
(C3) subjecting the slurry to tape casting to form the flexible lead-free piezoelectric composite film.

10. The method according to claim 9, wherein the step (C) further comprises:
(C4) after step (C3), subjecting the flexible lead-free piezoelectric composite film to an internal stress relief treatment.

11. The method according to claim 9, wherein the solution of the PVDF matrix is a solution of PVDF in N-methylpyrrolidone (NMP), and a weight ratio of PVDF to NMP is 1:8-12; and
the solution of the PVDF matrix further contains an initiator and a dispersant.

12. The method according to claim 1, wherein a diameter of a core part of the core-shell nanoparticle is 80-150 nm; and a thickness of a shell part of the core-shell nanoparticle is 5-50 nm.

13. The method according to claim 1, wherein a weight percentage of the core-shell nanoparticle in the flexible lead-free piezoelectric composite film is 30-70%; and
the PVDF matrix is a PVDF polymer with a β-crystalline phase content exceeding 80%.

14. An electronic device, comprising:

the flexible lead-free piezoelectric composite film according to claim 13.

15. The electronic device according to claim 14, wherein the electronic device is an atomizer comprising:

an atomizing component;

wherein the atomizing component comprises a flexible substrate, an electrode layer, a piezoelectric functional layer and a waterproof protection layer stacked in sequence; and the piezoelectric functional layer is the flexible lead-free piezoelectric composite film.

16. The electronic device according to claim 15, wherein the electrode layer has an interdigital electrode structure with an electrode width of 50-200 μm and an electrode spacing of 100-300 μm.

17. The electronic device according to claim 15, wherein the flexible substrate is made of a polyimide (PI) film or a polyethylene terephthalate (PET) film; a thickness of the flexible substrate is 50-200 μm; and a surface roughness Ra of the flexible substrate is not greater than 0.1 μm.

18. A flexible lead-free piezoelectric composite film, wherein the flexible lead-free piezoelectric composite film is prepared by the method according to claim 1.

\* \* \* \* \*